United States Patent
Choi

(10) Patent No.: US 11,657,882 B2
(45) Date of Patent: May 23, 2023

(54) MEMORY DEVICE AND METHOD OF OPERATING THE MEMORY DEVICE

(71) Applicant: SK hynix Inc., Icheon-si Gyeonggi-do (KR)

(72) Inventor: Hyung Jin Choi, Icheon-si Gyeonggi-do (KR)

(73) Assignee: SK hynix Inc., Icheon-si (KR)

(*) Notice: Subject to any disclaimer, the term of this patent is extended or adjusted under 35 U.S.C. 154(b) by 83 days.

(21) Appl. No.: 17/245,699

(22) Filed: Apr. 30, 2021

(65) Prior Publication Data

US 2022/0130473 A1 Apr. 28, 2022

(30) Foreign Application Priority Data

Oct. 26, 2020 (KR) .................. 10-2020-0139629

(51) Int. Cl.
| | |
|---|---|
| *G11C 16/34* | (2006.01) |
| *G11C 16/26* | (2006.01) |
| *G11C 16/32* | (2006.01) |
| *G11C 16/30* | (2006.01) |
| *G11C 16/10* | (2006.01) |

(52) U.S. Cl.
CPC ........ *G11C 16/3404* (2013.01); *G11C 16/102* (2013.01); *G11C 16/26* (2013.01); *G11C 16/30* (2013.01); *G11C 16/32* (2013.01)

(58) Field of Classification Search
CPC ... G11C 16/34; G11C 16/3404; G11C 16/102; G11C 16/26; G11C 16/30; G11C 16/32
See application file for complete search history.

(56) References Cited

U.S. PATENT DOCUMENTS

2018/0350446 A1* 12/2018 K .................... G11C 29/76
2019/0286516 A1* 9/2019 Jacobvitz .......... H03M 13/3753

FOREIGN PATENT DOCUMENTS

| KR | 101005188 B1 | 1/2011 |
|---|---|---|
| KR | 101868920 B1 | 6/2018 |

* cited by examiner

*Primary Examiner* — Alfredo Bermudez Lozada
(74) *Attorney, Agent, or Firm* — William Park & Associates Ltd.

(57) ABSTRACT

A memory device including a plurality of memory cells, a threshold voltage distribution measurement component configured to measure a threshold voltage distribution of a first read operation of sensing data from programmed memory cells among the plurality of memory cells, and a threshold voltage distribution of a second read operation of sensing the data from the programmed memory cells and outputting the data to an outside, a distribution shift compensation table generator configured to calculate a shift direction and a shift distance based on a result of comparing the threshold voltage distribution of the first read operation and the threshold voltage distribution of the second read operation, and generate a distribution shift compensation table based on the shift direction and the shift distance, and a read operation controller configured to perform a third read operation on target memory cells based on the distribution shift compensation table.

20 Claims, 16 Drawing Sheets

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2020-0139629 filed on Oct. 26, 2020, in the Korean Intellectual Property Office, the entire disclosure of which is incorporated by reference herein.

BACKGROUND

1. Technical Field

The present disclosure relates to an electronic device, and more particularly, to a memory device and a method of operating the memory device.

2. Related Art

A storage device is a device that stores data under control of a host device such as a computer or a smartphone. The storage device may include a memory device storing data and a memory controller controlling the memory device. The memory device may be classified into a volatile memory device and a nonvolatile memory device.

The volatile memory device may be a device that stores data only when power is supplied and loses the stored data when the power supply is cut off. The volatile memory device may include a static random access memory (SRAM), a dynamic random access memory (DRAM), and the like.

The nonvolatile memory device is a device that does not lose data even though power is cut off. The nonvolatile memory device includes a read only memory (ROM), a programmable ROM (PROM), an electrically programmable ROM (EPROM), an electrically erasable and programmable ROM (EEPROM), a flash memory, and the like.

SUMMARY

A memory device according to an embodiment of the present disclosure may include a plurality of memory cells, a threshold voltage distribution measurement component configured to measure a threshold voltage distribution of a first read operation of sensing data from programmed memory cells among the plurality of memory cells, and a threshold voltage distribution of a second read operation of sensing the data from the programmed memory cells and outputting the data using a data out operation, a distribution shift compensation table generator configured to calculate a shift direction indicating a direction in which the threshold voltage distribution of the second read operation is shifted and a shift distance indicating a distance at which the threshold voltage distribution of the second read operation is shifted based on the threshold voltage distribution of the first read operation, based on a result of comparing the threshold voltage distribution of the first read operation and the threshold voltage distribution of the second read operation, and generate a distribution shift compensation table based on the shift direction and the shift distance, and a read operation controller configured to perform a third read operation on target memory cells among the plurality of memory cells based on the distribution shift compensation table.

A method of operating a memory device according to an embodiment of the present disclosure may include performing a program operation on a plurality of memory cells, measuring a threshold voltage distribution of a first read operation by performing the first read operation of sensing data from the plurality of memory cells, measuring a threshold voltage distribution of a second read operation by performing the second read operation of sensing the data from the plurality of memory cells and outputting the data using a data out operation, calculating a shift direction indicating a direction in which the threshold voltage distribution of the second read operation is shifted and a shift distance indicating a distance at which the threshold voltage distribution of the second read operation is shifted based on the threshold voltage distribution of the first read operation, based on a result of comparing the threshold voltage distribution of the first read operation and the threshold voltage distribution of the second read operation, generating a distribution shift compensation table based on the shift direction and the shift distance, and performing a third read operation on target memory cells based on the distribution shift compensation table.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

An embodiment of the present disclosure provides a memory device capable of compensating for a shifted threshold voltage distribution during a sensing operation and a data out operation, and a method of operating the memory device.

According to the present technology, a memory device capable of compensating for a shifted threshold voltage distribution during a sensing operation and a data out operation, and a method of operating the memory device are provided.

Figure 1:
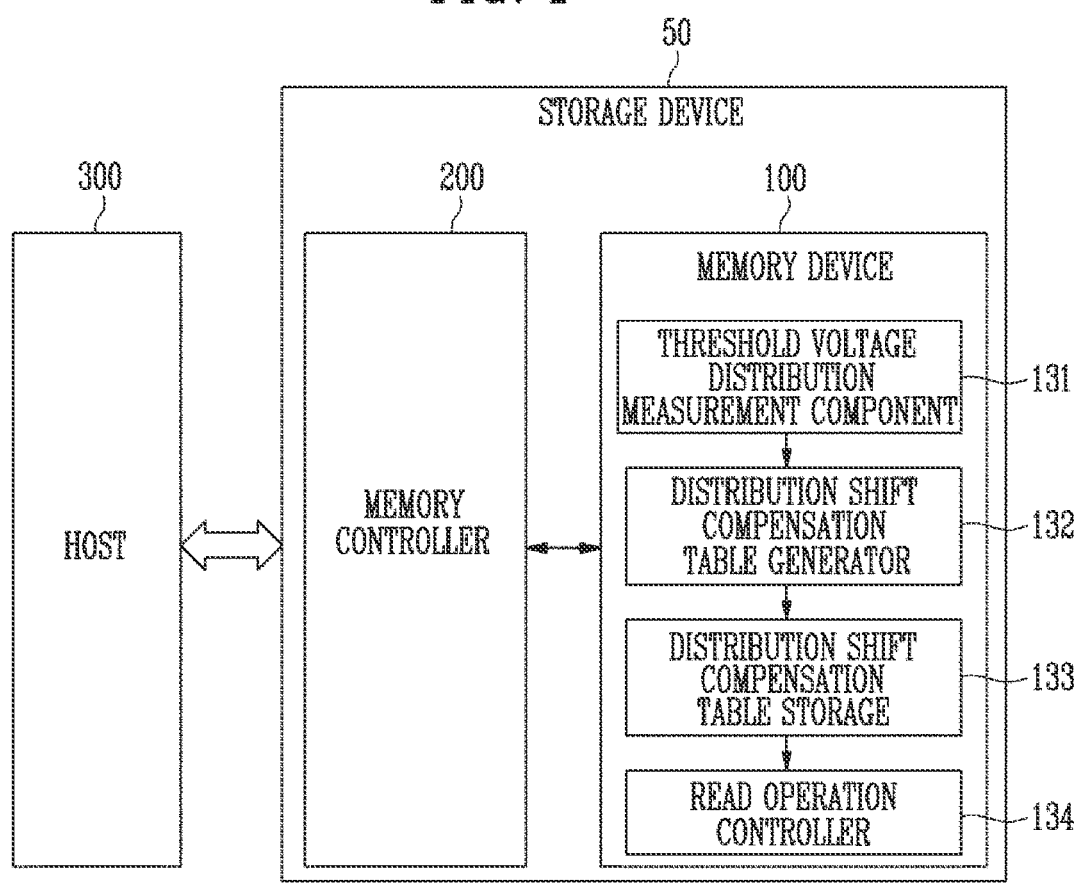
FIG. 1 is a diagram illustrating a storage device according to an embodiment of the present disclosure.

FIG. 1 is a diagram illustrating a storage device according to an embodiment of the present disclosure.

Referring to FIG. 1, the storage device 50 may include a memory device 100 and a memory controller 200 that controls an operation of the memory device. The storage device 50 may be a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array (not shown) including a plurality of memory cells that store data.

Each of the memory cells may be configured as a single level cell (SLC) that stores one data bit, a multi-level cell (MLC) that stores two data bits, a triple level cell (TLC) that stores three data bits, or a quad level cell (QLC) capable of storing four data bits.

The memory cell array (not shown) may include a plurality of memory blocks. One memory block may include a plurality of pages. In an embodiment, the page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 is configured to receive a command CMD and an address ADDR from the memory controller 200 and access an area selected by the address in the memory cell array. The memory device 100 may perform an operation instructed by the command CMD on the area selected by the address ADDR. For example, the memory device 100 may perform a write operation (program operation), a read operation, and an erase operation. During the program operation, the memory device 100 may program data to the area selected by the address ADDR. During the read operation, the memory device 100 may read data from the area selected by the address ADDR. During the erase operation, the memory device 100 may erase data stored in the area selected by the address ADDR.

In an embodiment, the memory device 100 may include a threshold voltage distribution measurement component 131, a distribution shift compensation table generator 132, a distribution shift compensation table storage 133, and a read operation controller 134.

The threshold voltage distribution measurement component 131 may measure a threshold voltage distribution indicating a result of performing the read operation.

In an embodiment, the threshold voltage distribution measurement component 131 may measure a threshold voltage distribution corresponding to a first read operation and a threshold voltage distribution corresponding to a second read operation. At this time, the first read operation may be an operation of sensing data from programmed memory cells among the plurality of memory cells. The second read operation may be an operation of sensing the data from the programmed memory cells and outputting the data to the outside. A description of the first read operation and the second read operation is described with reference to FIG. 7.

For example, the threshold voltage distribution measurement component 131 may perform a program operation on the plurality of memory cells. In an embodiment, the threshold voltage distribution measurement component 131 may perform a program operation in a single level cell unit on the plurality of memory cells.

In addition, the threshold voltage distribution measurement component 131 may sense the data from the programmed memory cells by performing the first read operation on the programmed memory cells. In an embodiment, the threshold voltage measurement component 131 may perform the first read operation in the single level cell unit. Thereafter, the threshold voltage distribution measurement component 131 may calculate the number of fail bits of the data sensed by the first read operation. At this time, the number of fail bits may represent the number of memory cells having a threshold voltage lower than a read voltage applied to the memory cells. The threshold voltage distribution measurement component 131 may measure the threshold voltage distribution corresponding to the first read operation based on the calculated number of fail bits.

In addition, the threshold voltage distribution measurement component 131 may sense the data from the programmed memory cells by performing a second read operation on the programmed memory cells. At this time, the second read operation may be an operation performed to generate a distribution shift compensation table. In an embodiment, the threshold voltage measurement component 131 may perform the second read operation in a single level cell unit. Thereafter, the threshold voltage distribution measurement component 131 may calculate the number of fail bits of the data sensed by the second read operation. The threshold voltage distribution measurement component 131 may measure a threshold voltage distribution corresponding to the second read operation based on the calculated number of fail bits.

Meanwhile, in the above-described example, the threshold voltage distribution measurement component 131 measures the threshold voltage distribution by performing the program operation and the read operation of the single level cell unit, but the present disclosure is not limited thereto. The threshold voltage distribution measurement component 131 may measure the threshold voltage distribution by performing a program operation and a read operation of a multi-level cell unit, a triple level cell unit, or a quad level cell unit.

The distribution shift compensation table generator 132 may generate the distribution shift compensation table. At this time, the distribution shift compensation table may include information for compensating for a shift phenomenon of the threshold voltage distribution occurring during a third read operation. In an embodiment, the distribution shift compensation table may include at least one of an evaluation time and a read voltage level to be used for the third read operation. The third read operation may be an operation of sensing the data from the programmed memory cells and outputting the data, after the distribution shift compensation table is generated.

In an embodiment, the distribution shift compensation table generator 132 may generate the distribution shift compensation table based on a result of comparing the threshold voltage distribution corresponding to the first read operation and the threshold voltage distribution corresponding to the second read operation.

For example, the distribution shift compensation table generator 132 may compare the threshold voltage distribution corresponding to the first read operation and the threshold voltage distribution corresponding to the second read operation. In addition, the distribution shift compensation table generator 132 may calculate a shift direction indicating a direction in which the threshold voltage distribution corresponding to the second read operation is shifted based on the threshold voltage distribution corresponding to the first read operation based on the comparison result. For example, the shift direction may indicate whether the threshold voltage distribution corresponding to the second read operation is shifted higher or lower than a threshold voltage distribution corresponding to the first read operation. In addition, the distribution shift compensation table generator 132 may calculate a shift distance indicating a distance at which the threshold voltage distribution corresponding to the second read operation is shifted based on the comparison result. Thereafter, the distribution shift compensation table generator 132 may generate the distribution shift compensation table based on the shift direction and the shift distance. For example, the distribution shift compensation table generator 132 may generate at least one of the evaluation time and the read voltage level to be used for the third read operation based on the shift direction and the shift distance.

In addition, in an embodiment, the distribution shift compensation table generator 132 may generate the distribution shift compensation table based on a result of comparing the number of fail bits of the data sensed by the first read operation and the number of fail bits of the data sensed by the second read operation. For example, the distribution shift compensation table generator 132 may calculate the shift direction and the shift distance based on a result of comparing the number of fail bits of the data sensed by the first read operation and the number of fail bits of the data sensed by the second read operation. Thereafter, the distribution shift compensation table generator 132 may generate the distribution shift compensation table based on the shift direction and the shift distance.

The distribution shift compensation table storage 133 may store the distribution shift compensation table.

The read operation controller 134 may control the read operation. The read operation may include the first read operation, the second read operation and the third read operation.

In an embodiment, the read operation controller 134 may perform the third read operation on target memory cells based on the distribution shift compensation table. At this time, the target memory cells may be memory cells on which the third read operation is to be performed according to the read command provided from the memory controller 200.

In an embodiment, the read operation controller 134 may perform the third read operation using at least one of the evaluation time and the read voltage level included in the distribution shift compensation table. For example, the read operation controller 134 may perform an evaluation operation based on the evaluation time included in the distribution shift compensation table during the third read operation. As another example, the read operation controller 134 may perform the third read operation using the read voltage level included in the distribution shift compensation table. In other words, the read operation controller 134 may compensate for a shift of the threshold voltage distribution generated by the third read operation by using information included in the distribution shift compensation table.

The memory controller 200 may control an overall operation of the storage device 50.

When power is applied to the storage device 50, the memory controller 200 may execute firmware (FW). When the memory device 100 is a flash memory device, the firmware (FW) may include a host interface layer (HIL) that controls communication with the host 300. The memory controller may include a flash translation layer (FTL) that controls communication between the host 300 and the memory device 100, and a flash interface layer (FIL) that controls communication with the memory device 100.

In an embodiment, the memory controller 200 may receive data and a logical block address (LBA) from the host 300 and may convert the LBA into a physical block address (PBA) indicating an address of memory cells in which data included in the memory device 100 is to be stored. In the present specification, the LBA and a "logic address" or a "logical address" may be used as the same meaning. In the present specification, the PBA and a "physical address" may be used as the same meaning.

The memory controller 200 may control the memory device 100 to perform the program operation, the read operation, the erase operation, or the like according to a request of the host 300. During the program operation, the memory controller 200 may provide a write command, the PBA, and data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may generate a command, an address, and data on independently regardless of the request from the host 300 and transmit the command, the address, and the data to the memory device 100. For example, the memory controller 200 may provide the command, the address, and the data for performing a read operation and program operations accompanying in performing wear leveling, read reclaim, garbage collection, and the like, to the memory device 100.

In an embodiment, the memory controller 200 may control at least two or more memory devices 100. In this case, the memory controller 200 may control the memory devices 100 according to an interleaving method to improve operation performance. The interleaving method may be a method of controlling operations for at least two memory devices 100 to overlap with each other.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
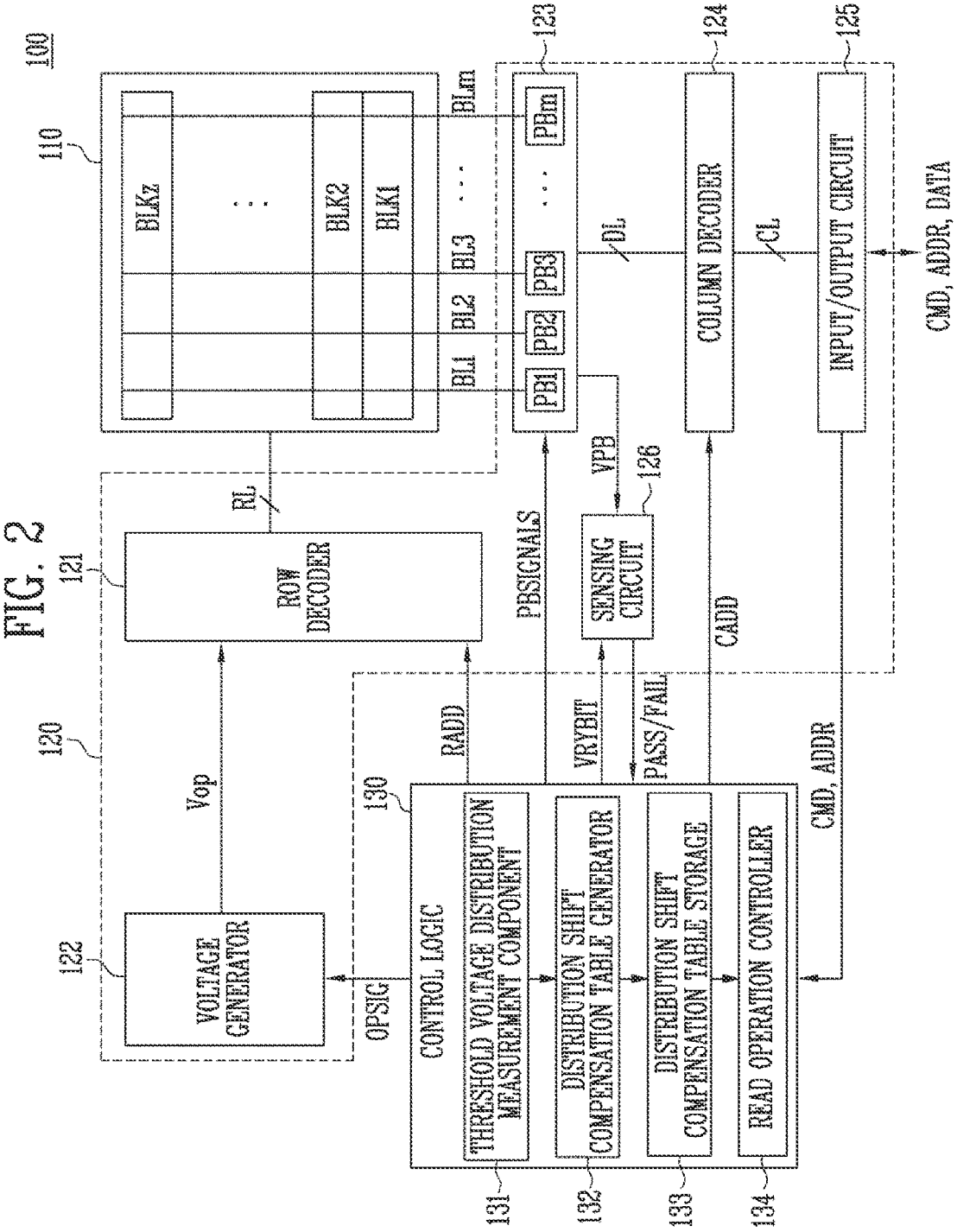
FIG. 2 is diagram illustrating a memory device of FIG. 1.

FIG. 2 is diagram illustrating the memory device 100 of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLm. Each of the plurality of memory blocks BLK1 to BLKz includes a plurality of memory cells. As an embodiment, the plurality of memory cells are nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as an SLC that stores one data bit, an MLC that stores two data bits, a TLC that stores three data bits, or a QLC that stores four data bits.

The peripheral circuit 120 may be configured to perform the program operation, the read operation, or the erase operation on a selected area of the memory cell array 110 under control of the control logic 130. The peripheral circuit 120 may drive the memory cell array 110. For example, the peripheral circuit 120 may apply various operation voltages to the row lines RL and the bit lines BL1 to BLm or discharge the applied voltages under the control of the control logic 130.

The peripheral circuit 120 may include a row decoder 121, a voltage generator 122, the page buffer group 123, a column decoder 124, and an input/output circuit 125.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to operate in response to control of the control logic 130. The row decoder 121 receives a row address RADD from the control logic 130.

The row decoder 121 is configured to decode the row address RADD received from the control logic 130. The row decoder 121 selects at least one memory block among the memory blocks BLK1 to BLKz according to a decoded address. In addition, the row decoder 121 may select at least one word line of the memory block selected to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop used for the program, read, and erase operations, in response to operation signal OPSIG. For example, the voltage generator 122 may generate the program voltage, the verify voltage, the pass voltage, the read voltage, the erase voltage, and the like in response to the control of the control logic 130.

As an embodiment, the voltage generator 122 may generate an internal power voltage by regulating the external power voltage. The internal power voltage generated by the voltage generator 122 is used as an operation voltage of the memory device 100.

As an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to m-th page buffers PB1 to PBm. The first to m-th page buffers PB1 to PBm are connected to the memory cell array 110 through the first to m-th bit lines BL1 to BLm, respectively. The first to m-th page buffers PB1 to PBm operate in response to the control of the control logic 130. Specifically, the first to m-th page buffers PB1 to PBm may operate in response to page buffer control signals PBSIGNALS. For example, the first to m-th page buffers PB1 to PBm may temporarily store data received through the first to m-th bit lines BL1 to BLm, or may sense a voltage or a current of the bit lines BL1 to BLm during the read or verify operation. In an embodiment, m and z may be a natural numbers.

Specifically, during the program operation, when the program pulse is applied to the selected word line, the first to m-th page buffers PB1 to PBm may transfer data DATA received through the input/output circuit 125 to the selected memory cells through the first to m-th bit lines BL1 to BLm. The memory cells of the selected page are programmed according to the transferred data DATA. The memory cell connected to the bit line to which a program permission voltage (for example, a ground voltage) is applied may have an increased threshold voltage. The threshold voltage of the memory cell connected to the bit line to which a program inhibit voltage (for example, a power voltage) is applied may be maintained. During the program verify operation, the first to m-th page buffers PB1 to PBm read page data from the selected memory cells through the first to m-th bit lines BL1 to BLm.

During the read operation, the first to m-th page buffers PB1 to PBm read the data DATA from the memory cells of the selected page through the first to m-th bit lines BL1 to BLm, and outputs the read data DATA to the input/output circuit 125 under control of the column decoder 124.

During the erase operation, the first to m-th page buffers PB1 to PBm may float the first to m-th bit lines BL1 to BLm.

The column decoder 124 may transfer data between the input/output circuit 125 and the page buffer group 123 in response to a column address CADD. For example, the column decoder 124 may exchange data with the first to m-th page buffers PB1 to PBm through data lines DL, or may exchange data with the input/output circuit 125 through column lines CL.

The input/output circuit 125 may transfer the command CMD and the address ADDR received from the memory controller 200 described with reference to FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuits 120. In addition, the control logic 130 may determine whether the verity operation is passed or failed in response to the pass signal PASS or the fail signal FAIL.

In an embodiment, the control logic 130 may include a threshold voltage distribution measurement component 131, a distribution shift compensation table generator 132, a distribution shift compensation table storage 133, and a read operation controller 134. At this time, the threshold voltage distribution measurement component 131, the distribution shift compensation table generator 132, the distribution shift compensation table storage 133, and the read operation controller 134 may indicate the threshold voltage distribution measurement component 131, the distribution shift compensation table generator 132, the distribution shift compensation table storage 133, and the read operation controller 134 of FIG. 1, respectively.

Figure 3:
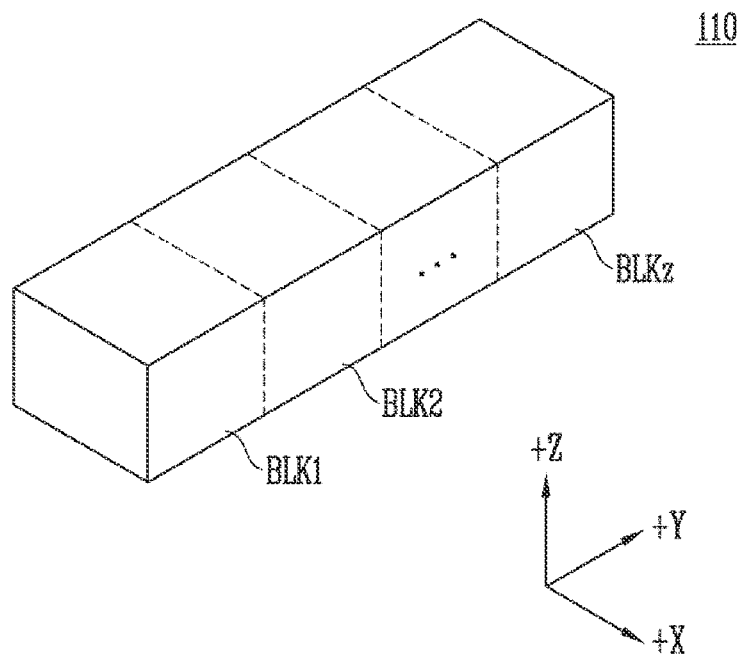
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described with reference to FIGS. 4 and 5.

Figure 4:
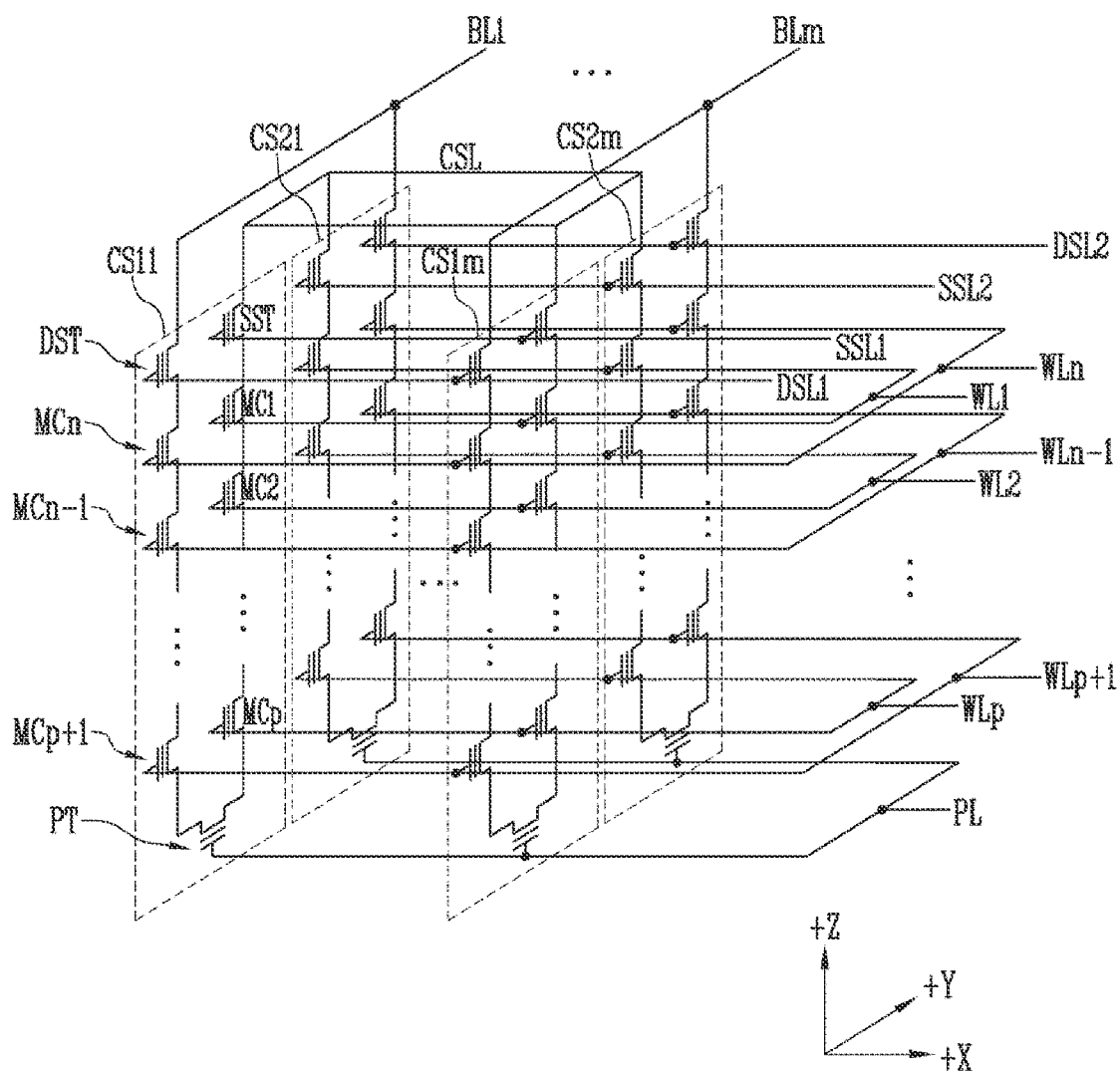
FIG. 4 is a circuit diagram illustrating any one memory block BLKa among memory blocks BLK1 to BLKz of FIG. 3.

FIG. 4 is a circuit diagram illustrating any one memory block BLKa among the memory blocks BLK1 to BLKz of FIG. 3.

Referring to FIG. 4, the memory block BLKa includes a plurality of memory cell strings CS11 to CS1$m$ and CS21 to CS2$m$. As an embodiment, each of the plurality of memory cell strings CS11 to CS1$m$ and CS21 to CS2$m$ may be formed in a 'U' shape. In the memory block BLKa, m memory cell strings are arranged in a row direction (that is, the +X direction). In FIG. 4, two memory cell strings are arranged in a column direction (that is, the +Y direction). However, this is for convenience of description and it may be understood that three or more memory cell strings may be arranged in the column direction.

Each of the plurality of memory cell strings CS11 to CS1$m$ and CS21 to CS2$m$ includes at least one source select transistor SST, first to n-th memory cells MC1 to MCn, a pipe transistor PT, and at least one drain select transistor DST. In an embodiment, n may be a natural number.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each memory cell string. As an embodiment, a pillar for providing at least one of the channel layer, the tunneling insulating film, the charge storage film, and the blocking insulating film may be provided in each memory cell string.

The source select transistor SST of each memory cell string is connected between a common source line CSL and the memory cells MC1 to MCp. In an embodiment, p may be a natural number.

As an embodiment, the source select transistors of the memory cell strings arranged in the same row are connected to a source select line extending in the row direction, and the source select transistors of the memory cell strings arranged in different rows are connected to different source select lines. In FIG. 4, the source select transistors of the memory cell strings CS11 to CS1$m$ of a first row are connected to a first source select line SSL1. The source select transistors of the memory cell strings CS21 to CS2$m$ of a second row are connected to a second source select line SSL2.

As another embodiment, the source select transistors of the memory cell strings CS11 to CS1$m$ and CS21 to CS2$m$ may be commonly connected to one source select line.

The first to n-th memory cells MC1 to MCn of each memory cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each memory cell string are connected to the first to n-th word lines WL1 to WLn, respectively.

A gate of the pipe transistor PT of each memory cell string is connected to a pipeline PL.

The drain select transistor DST of each memory cell string is connected between a corresponding bit line and the memory cells MCp+1 to MCn. The memory cell strings arranged in the row direction are connected to the drain select line extending in the row direction. The drain select transistors of the memory cell strings CS11 to CS1$m$ of the first row are connected to a first drain select line DSL1. The drain select transistors of the memory cell strings CS21 to CS2$m$ of the second row are connected to a second drain select line DSL2.

The cell strings arranged in the column direction are connected to the bit lines extending in the column direction. In FIG. 4, the memory cell strings CS11 and CS21 of the first column are connected to the first bit line BL1. The memory cell strings CS1$m$ and CS2$m$ of the m-th column are connected to the m-th bit line BL$m$.

The memory cells connected to the same word line in the memory cell strings arranged in the row direction configure one page. For example, the memory cells connected to the first word line WL1, among the memory cell strings CS11 to CS1$m$ of the first row configure one page. The memory cells connected to the first word line WL1, among the memory cell strings CS21 to CS2$m$ of the second row configure another page. The memory cell strings arranged in one row direction may be selected by selecting any one of the drain select lines DSL1 and DSL2. One page of the selected memory cell strings may be selected by selecting any one of the word lines WL1 to WLn.

As another embodiment, even bit lines and odd bit lines may be provided instead of the first to m-th bit lines BL1 to BL$m$. In addition, even-numbered memory cell strings among the memory cell strings CS11 to CS1$m$ or CS21 to CS2$m$ arranged in the row direction may be connected to the even bit lines, and odd-numbered memory cell strings among the memory cell strings CS11 to CS1$m$ or CS21 to CS2$m$ arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation on the memory block BLKa is improved, however, the size of the memory block BLKa increases. As less memory cells are provided, the size of the memory block BLKa may be reduced, however, the reliability of the operation on the memory block BLKa may be reduced. In an embodiment, a may be a natural number.

In order to efficiently control at least one dummy memory cell, each of the dummy memory cells may have a required threshold voltage. Before or after an erase operation on the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 5:
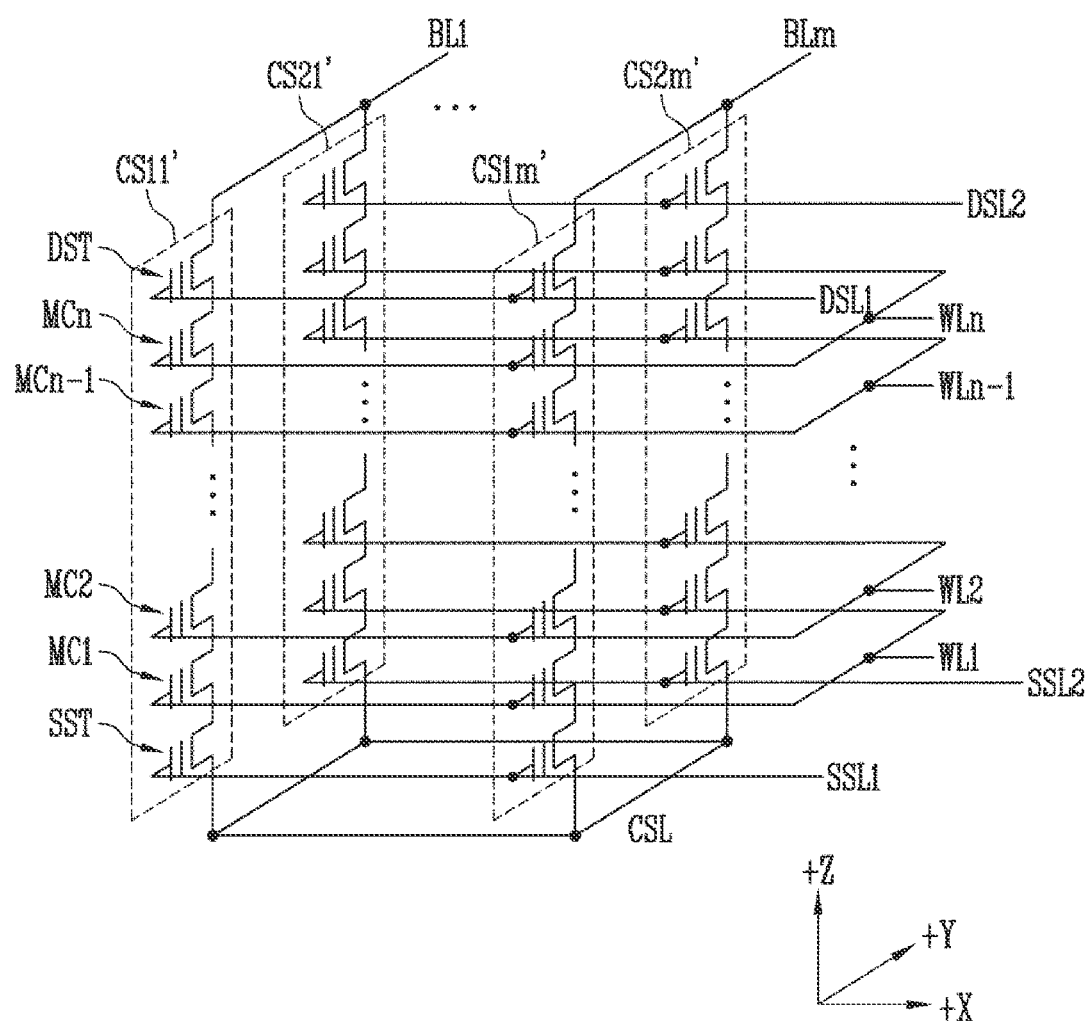
FIG. 5 is a circuit diagram illustrating another embodiment of any one memory block BLKb among the memory blocks BLK1 to BLKz of FIG. 3.

FIG. 5 is a circuit diagram illustrating another embodiment of any one memory block BLKb among the memory blocks BLK1 to BLKz of FIG. 3. In an embodiment, b may be a natural number.

Referring to FIG. 5, the memory block BLKb includes a plurality of memory cell strings CS11' to CS1$m$' and CS21' to CS2$m$'. Each of the plurality of memory cell strings CS11' to CS1$m$' and CS21' to CS2$m$' extends along a +Z direction. Each of the plurality of memory cell strings CS11' to CS1$m$' and CS21' to CS2$m$' includes at least one source select transistor SST, first to n-th memory cells MC1 to MCn, and at least one drain select transistor DST stacked on a substrate (not shown) under the memory block BLK1'.

The source select transistor SST of each memory cell string is connected between a common source line CSL and memory cells MC1 to MCn. The source select transistors of the memory cell strings arranged in the same row are connected to the same source select line. The source select transistors of the memory cell strings CS11' to CS1$m$' arranged in a first row are connected to a first source select line SSL1. The source select transistors of the memory cell strings CS21' to CS2m' arranged in a second row are connected to a second source select line SSL2. As another embodiment, the source select transistors of the memory cell strings CS11' to CS1m' and CS21' to CS2m' may be commonly connected to one source select line.

The first to n-th memory cells MC1 to MCn of each memory cell string are connected in series between the source select transistor SST and the drain select transistor DST. Gates of the first to n-th memory cells MC1 to MCn are connected to first to the n-th word lines WL1 to WLn, respectively.

The drain select transistor DST of each memory cell string is connected between a corresponding bit line and the memory cells MC1 to MCn. The drain select transistors of the memory cell strings arranged in the row direction are connected to a drain select line extending in the row direction. The drain select transistors of the memory cell strings CS11' to CS1m' of a first row are connected to a first drain select line DSL1. The drain select transistors of the memory cell strings CS21' to CS2m' of a second row are connected to a second drain select line DSL2.

As a result, the memory block BLKb of FIG. 5 has an equivalent circuit similar to that of the memory block BLKa of FIG. 4 except that the pipe transistor PT is excluded from each memory cell string.

As another embodiment, even bit lines and odd bit lines may be provided instead of the first to m-th bit lines BL1 to BLm. In addition, even-numbered memory cell strings among the memory cell strings CS11' to CS1m' or CS21' to CS2m' arranged in the row direction may be connected to even bit lines, and odd-numbered memory cell strings among the memory cell strings CS11' to CS1m' or CS21' to CS2m' arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation on the memory block BLKb is improved, however, the size of the memory block BLKb increases. As less memory cells are provided, the size of the memory block BLKb may be reduced, however, the reliability of the operation on the memory block BLKb may be reduced.

In order to efficiently control at least one dummy memory cell, each of the dummy memory cells may have a required threshold voltage. Before or after an erase operation on the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
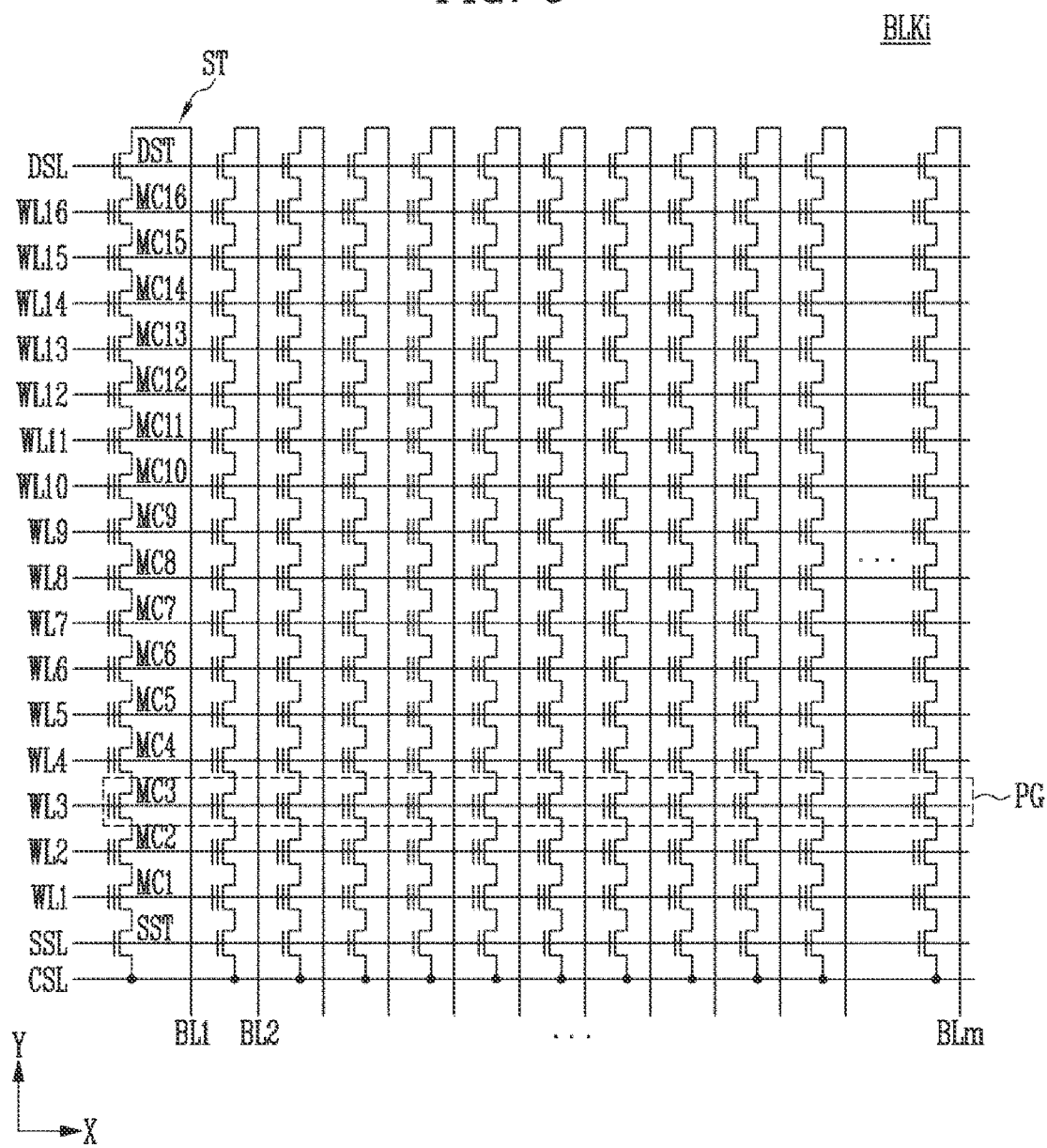
FIG. 6 is a diagram illustrating still another embodiment of any one memory block BLKi among the memory blocks BLK1 to BLKz of FIG. 3.

FIG. 6 is a diagram illustrating still another embodiment of any one memory block BLKi among the memory blocks BLK1 to BLKz of FIG. 3. In an embodiment, i may be a natural number.

Referring to FIG. 6, a plurality of word lines arranged in parallel with each other may be connected between a first select line and a second select line. Here, the first select line may be the source select line SSL, and the second select line may be the drain select line DSL. More specifically, the memory block BLKi may include a plurality of memory cells strings ST connected between the bit lines BL1 to BLm and a common source line CSL. The bit lines BL1 to BLm may be connected to the memory cell strings ST, respectively, and the common source line CSL may be commonly connected to the memory cell strings ST. Since the memory cells strings ST may be configured to be identical to each other, a memory cell string ST connected to the first bit line BL1 is specifically described, as an example.

The memory cell string ST may include a source select transistor SST, a plurality of memory cells MC1 to MC16, and a drain select transistor DST connected in series between the common source line CSL and the first bit line BL1. One memory cell string ST may include at least one or more of the drain select transistor DST, and may include the source select transistor SST and the memory cells MC1 to MC16 more than the number shown in the figure.

A source of the source select transistor SST may be connected to the common source line CSL and a drain of the drain select transistor DST may be connected to the first bit line BL1. The memory cells MC1 to MC16 may be connected in series between the source select transistor SST and the drain select transistor DST. Gates of the source select transistors SST included in the different memory cell strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line among the memory cells included in different memory cell strings ST may be referred to as a page PG. Therefore, the memory block BLKi may include the pages PG of the number of the word lines WL1 to WL16.

One memory cell may store one bit of data. This is commonly called an SLC. In this case, one physical page PG may store one logical page (LPG) data. The one logical page (LPG) data may include data bits of the same number as cells included in one physical page PG.

The one memory cell may store two or more bits of data. In this case, one physical page PG may store two or more logical page (LPG) data.

Figure 7:
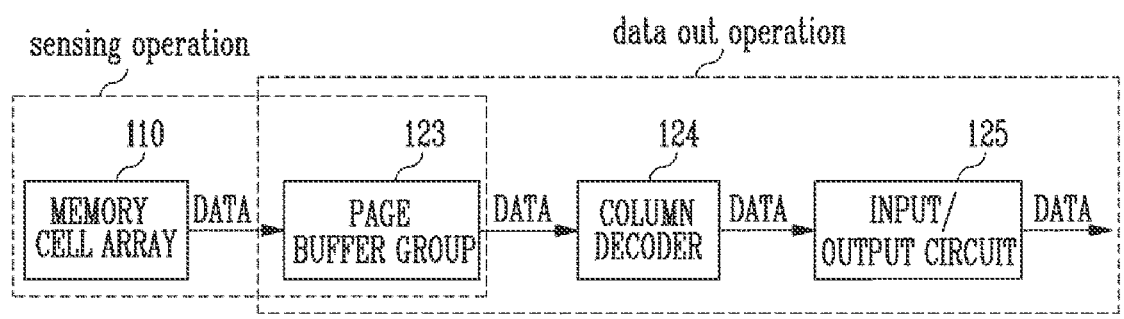
FIG. 7 is a diagram illustrating a first read operation, a second read operation and a third read operation according to an embodiment of the present disclosure.

FIG. 7 is a diagram illustrating a first read operation, a second read operation and a third read operation according to an embodiment of the present disclosure.

A memory cell array 110, a page buffer group 123, a column decoder 124, and an input/output circuit 125 of FIG. 7 may indicate the memory cell array 110, the page buffer group 123, the column decoder 124, and the input/output circuit 125 of FIG. 2, respectively.

In an embodiment, the memory device 100 may perform a sensing operation and a data out operation according to the read command of the memory controller 200.

In an embodiment, the sensing operation may be an operation of sensing data DATA from the memory cell array 110 based on an address corresponding to the read command and storing the sensed data DATA in any one of the plurality of page buffers included in the page buffer group 123.

In an embodiment, the data out operation may be an operation of outputting the data DATA stored in the page buffer group 123 according to the sensing operation to the outside through the column decoder 124 and the input/output circuit 125. For example, the data out operation may be an operation of outputting the sensed data DATA to the memory controller 200.

In an embodiment, the first read operation may include the sensing operation.

In an embodiment, the second read operation and the third read operation may include the sensing operation and the data out operation. For example, the second read operation may be an operation performed to generate a distribution shift compensation table. The third read operation may be an operation performed after the distribution shift compensation table is generated.

Meanwhile, in a case of a cache read operation, the sensing operation and the data out operation may be simultaneously performed. At this time, since the data out operation may affect the sensing operation, noise may occur in the sensing operation. Accordingly, the threshold voltage distribution corresponding to the cache read operation may be shifted based on the threshold voltage distribution corresponding to the first read operation. In addition, the number of fail bits of the data sensed by the cache read operation may increase, and thus a read fail may occur. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

Therefore, according to an embodiment of the present disclosure, the distribution shift compensation table may be generated based on the result of comparing the threshold voltage distribution corresponding to the first read operation and the threshold voltage distribution corresponding to the second read operation and perform the third read operation using the generated distribution shift compensation table to compensate for the threshold voltage distribution shifted.

Figure 8A:
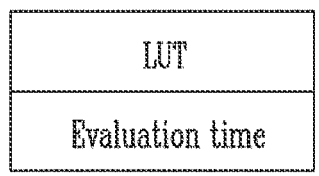
FIG. 8A is a diagram illustrating a distribution shift compensation table including an evaluation time to be used for a third read operation according to an embodiment of the present disclosure.

FIG. 8A is a diagram illustrating a distribution shift compensation table including an evaluation time to be used for a third read operation according to an embodiment of the present disclosure.

Referring to FIG. 8A, the distribution shift compensation table LUT may include an evaluation time Evaluation time to be used for the third read operation. At this time, the evaluation time Evaluation time may be increased to greater than or decreased to less than a reference evaluation time. In an embodiment, the reference evaluation time may be an evaluation time used for an evaluation operation performed during the verify operation.

In an embodiment, the distribution shift compensation table generator 132 may generate the distribution shift compensation table LUT including the evaluation time Evaluation time based on the result of comparing the threshold voltage distribution corresponding to the first read operation and the threshold voltage distribution corresponding to the second read operation. The distribution shift compensation table LUT may be stored in the distribution shift compensation table storage 133.

In an embodiment, the read operation controller 134 may perform the third read operation using the evaluation time Evaluation time included in the distribution shift compensation table LUT.

Figure 8B:
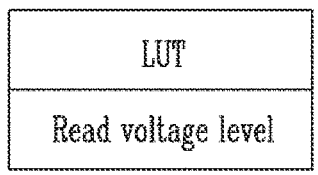
FIG. 8B is a diagram illustrating a distribution shift compensation table including a read voltage level to be used for a third read operation according to an embodiment of the present disclosure.

FIG. 8B is a diagram illustrating a distribution shift compensation table including a read voltage level to be used for a third read operation according to an embodiment of the present disclosure.

Referring to FIG. 8B, the distribution shift compensation table LUT may include a read voltage level Read voltage level to be used for the third read operation. At this time, the read voltage level Read voltage level may be increased to greater than or decreased to less than a reference read voltage level. In an embodiment, the reference read voltage level may be a default read voltage. In an embodiment, the default read voltage may be a read voltage determined through a test in a manufacturing process of the memory device 100.

In an embodiment, the distribution shift compensation table generator 132 may generate the distribution shift compensation table LUT including the read voltage level Read voltage level based on the result of comparing the threshold voltage distribution corresponding to the first read operation and the threshold voltage distribution corresponding to the second read operation. The distribution shift compensation table LUT may be stored in the distribution shift compensation table storage 133.

In an embodiment, the read operation controller 134 may perform the third read operation using the read voltage level Read voltage level included in the distribution shift compensation table LUT.

Figure 9A:
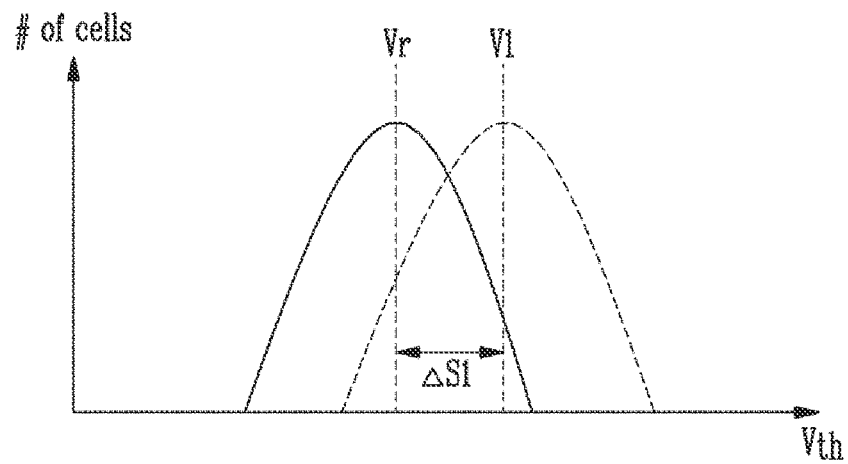
FIG. 9A is a diagram illustrating an example in which a threshold voltage distribution corresponding to a second read operation is shifted higher than a threshold voltage distribution corresponding to a first read operation according to an embodiment of the present disclosure.

FIG. 9A is a diagram illustrating an example in which a threshold voltage distribution corresponding to a second read operation is shifted higher than a threshold voltage distribution corresponding to a first read operation according to an embodiment of the present disclosure.

In FIG. 9A, a horizontal axis indicates a threshold voltage of the memory cells, and a vertical axis indicates the number of memory cells.

In FIG. 9A, for convenience of description, it is assumed that the memory cell is programmed as an SLC cell storing one bit of data, but the present disclosure is not limited thereto.

Referring to FIG. 9A, a threshold voltage distribution indicating a result of performing a first read operation at a reference read voltage level Vr on the programmed memory cells is shown by a solid line. In addition, a threshold voltage distribution indicating a result of performing a second read operation at the reference read voltage level Vr on the programmed memory cells is shown by a dotted line.

Specifically, the distribution shift compensation table generator 132 may compare the threshold voltage distribution corresponding to the second read operation and the threshold voltage distribution corresponding to the first read operation to determine that the threshold voltage distribution corresponding to the second read operation is shifted higher than the threshold voltage distribution corresponding to the first read operation. In addition, the distribution shift compensation table generator 132 may calculate a shift distance $\Delta S1$ between the threshold voltage distribution corresponding to the second read operation and the threshold voltage distribution corresponding to the first read operation. For example, if the number of fail bits according to the first read operation is greater than the number of fail bits according to the second read operation, the threshold voltage distribution corresponding to the second read operation is shifted higher than the threshold voltage distribution corresponding to the first read operation. The distribution shift compensation table generator 132 may determine the shift distance $\Delta S1$ based on a difference between the number of fail bits according to the first read operation and the number of fail bits according to the second read operation. In this case, in order to compensate for the shift of the threshold voltage distribution generated during the third read operation, a read voltage level used for the third read operation may be moved to a first read voltage level V1 higher than the reference read voltage level Vr.

Figure 9B:
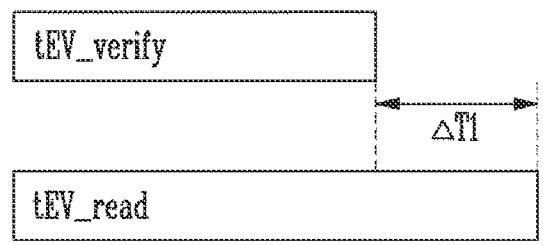
FIG. 9B is a diagram illustrating an evaluation time to be used for a second read operation according to an embodiment of the present disclosure.

FIG. 9B is a diagram illustrating an evaluation time to be used for a third read operation according to an embodiment of the present disclosure.

Specifically, FIG. 9B is a diagram illustrating the evaluation time to be used for the third read operation when the threshold voltage distribution corresponding to the second read operation is shifted higher than the threshold voltage distribution corresponding to the first read operation as shown in FIG. 9A.

Referring to FIGS. 9A and 9B, the distribution shift compensation table generator 132 may generate the distribution shift compensation table including the evaluation time increased to greater than a reference evaluation time based on the shift distance, when the threshold voltage distribution corresponding to the second read operation is shifted higher than the threshold voltage distribution corresponding to the first read operation. In an embodiment, the reference evaluation time may be an evaluation time tEV_verify of the evaluation operation performed during the verify operation.

For example, the distribution shift compensation table generator 132 may determine an evaluation time tEV_read increased to greater than the evaluation time tEV_verify used for the verify operation as the evaluation time to be used for the third read operation. At this time, a difference $\Delta T1$ between the evaluation time tEV_verify used for the verify operation and the increased evaluation time tEV_read may be determined based on the shift distance $\Delta S1$.

Thereafter, the read operation controller 134 may perform the evaluation operation included in the third read operation using the increased evaluation time tEV_read.

Figure 9C:
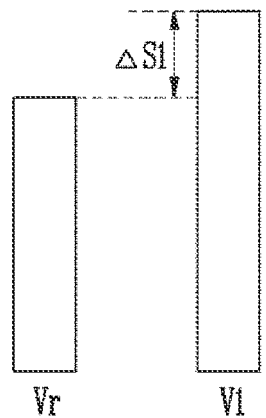
FIG. 9C is a diagram illustrating a read voltage level to be used for a third read operation according to an embodiment of the present disclosure.

FIG. 9C is a diagram illustrating a read voltage level to be used for a third read operation according to an embodiment of the present disclosure.

Specifically, FIG. 9C is a diagram illustrating the read voltage level to be used for the third read operation when the threshold voltage distribution corresponding to the second read operation is shifted higher than the threshold voltage distribution corresponding to the first read operation as shown in FIG. 9A.

Referring to FIGS. 9A and 9C, the distribution shift compensation table generator 132 may generate the distribution shift compensation table including the read voltage level higher than the reference read voltage level based on the shift distance, when the threshold voltage distribution corresponding to the second read operation is shifted higher than the threshold voltage distribution corresponding to the first read operation. In an embodiment, the reference read voltage level may be a default read voltage level.

For example, the distribution shift compensation table generator 132 may determine the first read voltage level V1 higher than the reference read voltage level Vr as the read voltage level to be used for the third read operation. At this time, a difference (i.e., shift distance $\Delta S1$) between the reference read voltage level Vr and the first read voltage level V1 may be determined based on the shift distance $\Delta S1$.

Thereafter, the read operation controller 134 may perform the third read operation using the first read voltage level V1.

Figure 10A:
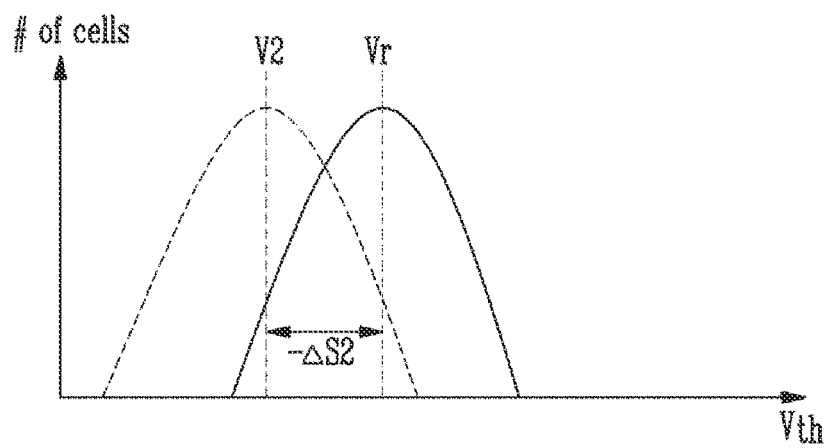
FIG. 10A is a diagram illustrating an example in which a threshold voltage distribution corresponding to a second read operation is shifted lower than a threshold voltage distribution corresponding to a first read operation according to an embodiment of the present disclosure.

FIG. 10A is a diagram illustrating an example in which a threshold voltage distribution corresponding to a second read operation is shifted lower than a threshold voltage distribution corresponding to a first read operation according to an embodiment of the present disclosure.

In FIG. 10A, a horizontal axis indicates a threshold voltage of the memory cells, and a vertical axis indicates the number of memory cells.

In FIG. 10A, for convenience of description, it is assumed that the memory cell is programmed as an SLC cell storing one bit of data, but the present disclosure is not limited thereto.

Referring to FIG. 10A, a threshold voltage distribution indicating a result of performing a first read operation at a reference read voltage level Vr on the programmed memory cells is shown by a solid line. In addition, a threshold voltage distribution indicating a result of performing a second read operation at the reference read voltage level Vr on the programmed memory cells is shown by a dotted line.

Specifically, the distribution shift compensation table generator 132 may compare the threshold voltage distribution corresponding to the second read operation and the threshold voltage distribution corresponding to the first read operation to determine that the threshold voltage distribution corresponding to the second read operation is shifted lower than the threshold voltage distribution corresponding to the first read operation. In addition, the distribution shift compensation table generator 132 may calculate a shift distance $-\Delta S2$ between the threshold voltage distribution corresponding to the second read operation and the threshold voltage distribution corresponding to the first read operation. For example, if the number of fail bits according to the first read operation is less than the number of fail bits according to the second read operation, the threshold voltage distribution corresponding to the second read operation is shifted lower than the threshold voltage distribution corresponding to the first read operation. The distribution shift compensation table generator 132 may determine the shift distance $-\Delta S2$ based on a difference between the number of fail bits according to the first read operation and the number of fail bits according to the second read operation. In this case, in order to compensate for the shift of the threshold voltage distribution generated during the third read operation, a read voltage level used for the third read operation may be moved to a second read voltage level V2 lower than the reference read voltage level Vr.

Figure 10B:
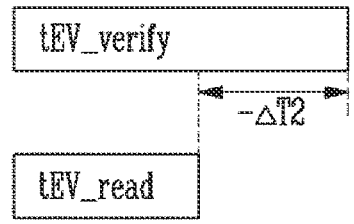
FIG. 10B is a diagram illustrating an evaluation time to be used for a second read operation according to an embodiment of the present disclosure.

FIG. 10B is a diagram illustrating an evaluation time to be used for a third read operation according to an embodiment of the present disclosure.

Specifically, FIG. 10B is a diagram illustrating the evaluation time to be used for the third read operation when the threshold voltage distribution corresponding to the second read operation is shifted lower than the threshold voltage distribution corresponding to the first read operation as shown in FIG. 10A.

Referring to FIGS. 10A and 10B, the distribution shift compensation table generator 132 may generate the distribution shift compensation table including the evaluation time decreased to less than a reference evaluation time based on the shift distance, when the threshold voltage distribution corresponding to the second read operation is shifted lower than the threshold voltage distribution corresponding to the first read operation. In an embodiment, the reference evaluation time may be an evaluation time tEV_verify of the evaluation operation performed during the verify operation.

For example, the distribution shift compensation table generator 132 may determine an evaluation time tEV_read decreased to less than the evaluation time tEV_verify used for the verify operation as the evaluation time to be used for the third read operation. At this time, a difference $-\Delta T2$ between the evaluation time tEV_verify used for the verify operation and the decreased evaluation time tEV_read may be determined based on the shift distance $-\Delta S2$.

Thereafter, the read operation controller 134 may perform the evaluation operation included in the third read operation using the decreased evaluation time tEV_read.

Figure 10C:
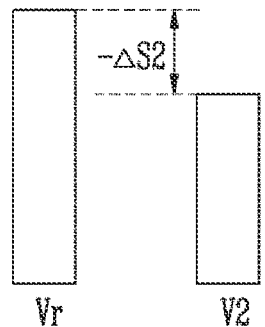
FIG. 10C is a diagram illustrating a read voltage level to be used for a third read operation according to an embodiment of the present disclosure.

FIG. 10C is a diagram illustrating a read voltage level to be used for a third read operation according to an embodiment of the present disclosure.

Specifically, FIG. 10C is a diagram illustrating the read voltage level to be used for the third read operation when the threshold voltage distribution corresponding to the second read operation is shifted lower than the threshold voltage distribution corresponding to the first read operation as shown in FIG. 10A.

Referring to FIGS. 10A and 10C, the distribution shift compensation table generator 132 may generate the distribution shift compensation table including the read voltage level lower than the reference read voltage level based on the shift distance, when the threshold voltage distribution corresponding to the second read operation is shifted lower than the threshold voltage distribution corresponding to the first read operation. In an embodiment, the reference read voltage level may be a default read voltage level.

For example, the distribution shift compensation table generator 132 may determine the second read voltage level V2 lower than the reference read voltage level Vr as the read voltage level to be used for the third read operation. At this time, a difference (i.e., the shift distance −ΔS2) between the reference read voltage level Vr and the second read voltage level V2 may be determined based on the shift distance −ΔS2.

Thereafter, the read operation controller 134 may perform the third read operation using the second read voltage level V2.

Figure 11:
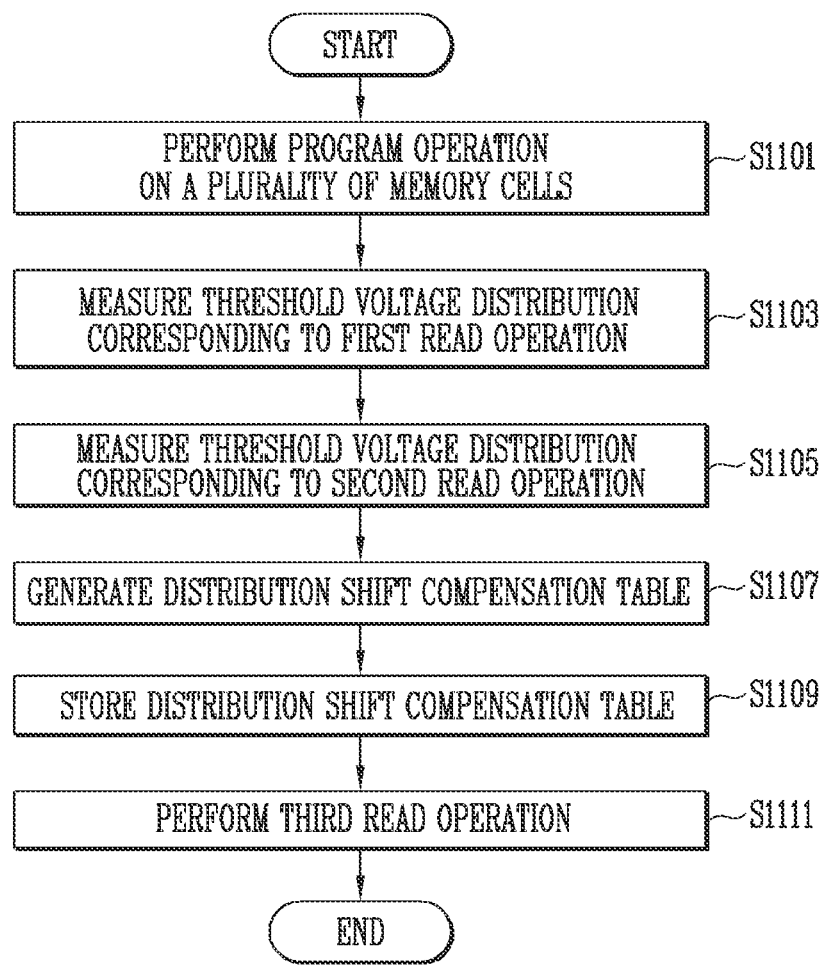
FIG. 11 is a flowchart illustrating a method of operating a memory device according to an embodiment of the present disclosure.

FIG. 11 is a flowchart illustrating a method of operating a memory device according to an embodiment of the present disclosure.

The method shown in FIG. 11 may be performed by, for example, the memory device 100 shown in FIG. 1.

Referring to FIG. 11, in step S1101, the memory device 100 may perform the program operation on the plurality of memory cells.

In step S1103, the memory device 100 may measure the threshold voltage distribution corresponding to the first read operation by performing the first read operation of sensing data from the plurality of memory cells.

At this time, the memory device 100 may measure the threshold voltage distribution corresponding to the first read operation by calculating the number of fail bits of the data sensed by the first read operation on the plurality of memory cells.

In step S1105, the memory device 100 may measure the threshold voltage distribution corresponding to the second read operation by performing the second read operation of sensing the data from the plurality of memory cells and outputting the data to the outside.

At this time, the memory device 100 may measure the threshold voltage distribution corresponding to the second read operation by calculating the number of fail bits of the data sensed by the second read operation on the plurality of memory cells.

In step S1107, the memory device 100 may generate the distribution shift compensation table based on the result of comparing the threshold voltage distribution corresponding to the first read operation and the threshold voltage distribution corresponding to the second read operation.

At this time, based on the result of comparing the threshold voltage distribution corresponding to the first read operation and the threshold voltage distribution corresponding to the second read operation, the memory device 100 may calculate the shift direction indicating the direction in which the threshold voltage distribution corresponding to the second read operation is shifted and the shift distance indicating the distance at which the threshold voltage distribution corresponding to the second read operation is shifted based on the threshold voltage distribution corresponding to the first read operation.

In addition, the memory device 100 may generate the distribution shift compensation table based on the shift direction and the shift distance.

In step S1109, the memory device 100 may store the distribution shift compensation table.

In step S1111, the memory device 100 may perform the third read operation on the target memory cells based on the distribution shift compensation table.

At this time, the memory device 100 may perform the third read operation using at least one of the evaluation time and the read voltage level.

Figure 12:
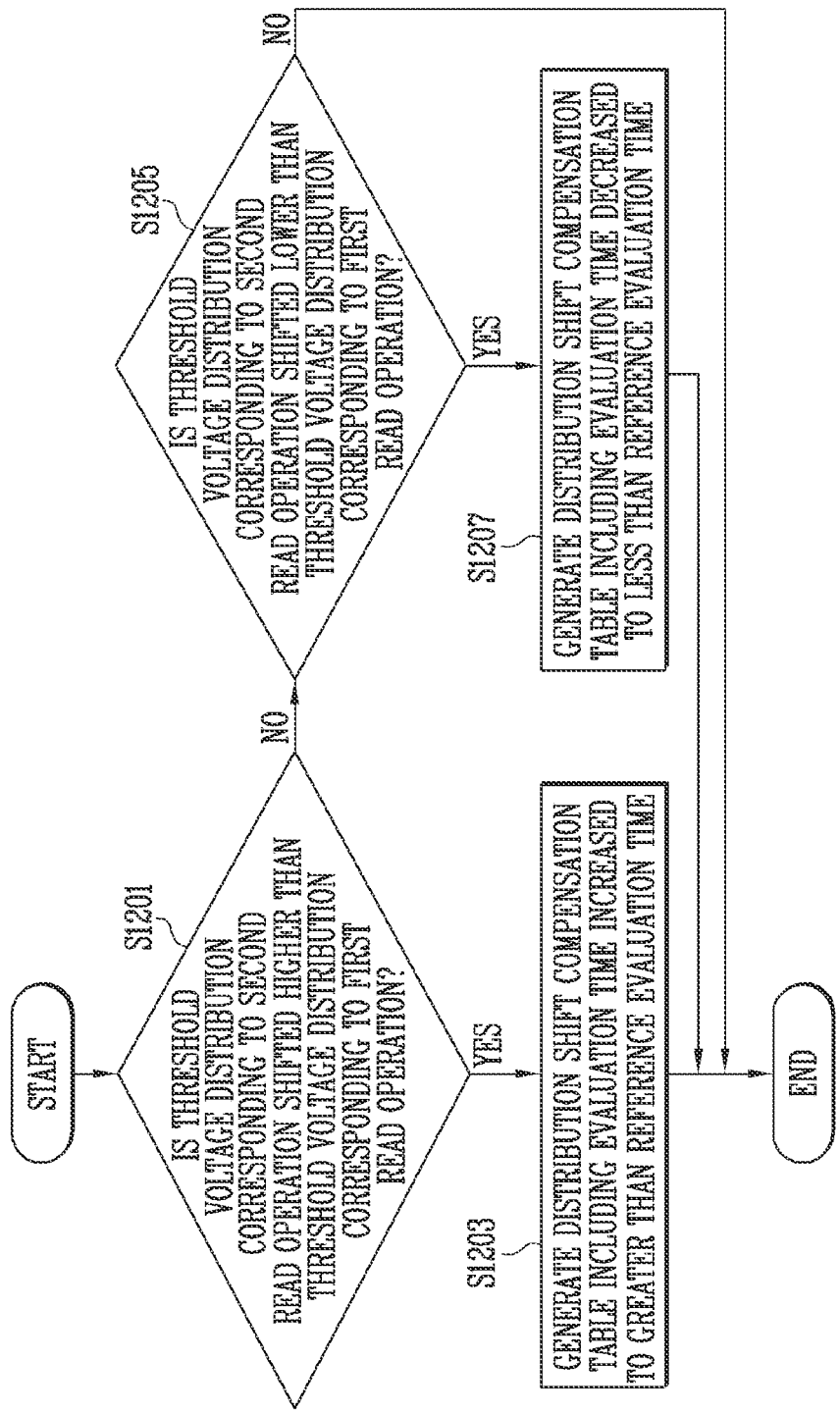
FIG. 12 is a flowchart illustrating a method of generating a distribution shift compensation table including an evaluation time to be used for a third read operation according to an embodiment of the present disclosure.

FIG. 12 is a flowchart illustrating a method of generating a distribution shift compensation table including an evaluation time to be used for a third read operation according to an embodiment of the present disclosure.

The method shown in FIG. 12 may be performed, for example, by the memory device 100 shown in FIG. 1.

Referring to FIG. 12, in step S1201, the memory device 100 may compare the threshold voltage distribution corresponding to the second read operation and the threshold voltage distribution corresponding to the first read operation to determine whether the threshold voltage distribution corresponding to the second read operation is shifted higher than the threshold voltage distribution corresponding to the first read operation.

When the threshold voltage distribution corresponding to the second read operation is shifted higher than the threshold voltage distribution corresponding to the first read operation according to a result of the determination in step S1201, in step S1203, the memory device 100 may generate the distribution shift compensation table including the evaluation time increased to greater than the reference evaluation time based on the shift distance.

When the threshold voltage distribution corresponding to the second read operation is not shifted higher than the threshold voltage distribution corresponding to the first read operation according to the result of the determination in step S1201, in step S1205, the memory device 100 may compare the threshold voltage distribution corresponding to the second read operation and the threshold voltage distribution corresponding to the first read operation to determine whether the threshold voltage distribution corresponding to the second read operation is shifted lower than the threshold voltage distribution corresponding to the first read operation.

When the threshold voltage distribution corresponding to the second read operation is shifted lower than the threshold voltage distribution corresponding to the first read operation according to a result of the determination in step S1205, in step S1207, the memory device 100 may generate the distribution shift compensation table including the evaluation time decreased to less than the reference evaluation time based on the shift distance.

When the threshold voltage distribution corresponding to the second read operation is not shifted lower than the threshold voltage distribution corresponding to the first read operation according to the result of the determination in step S1205, the operation of generating the distribution shift compensation table may be ended.

Figure 13:
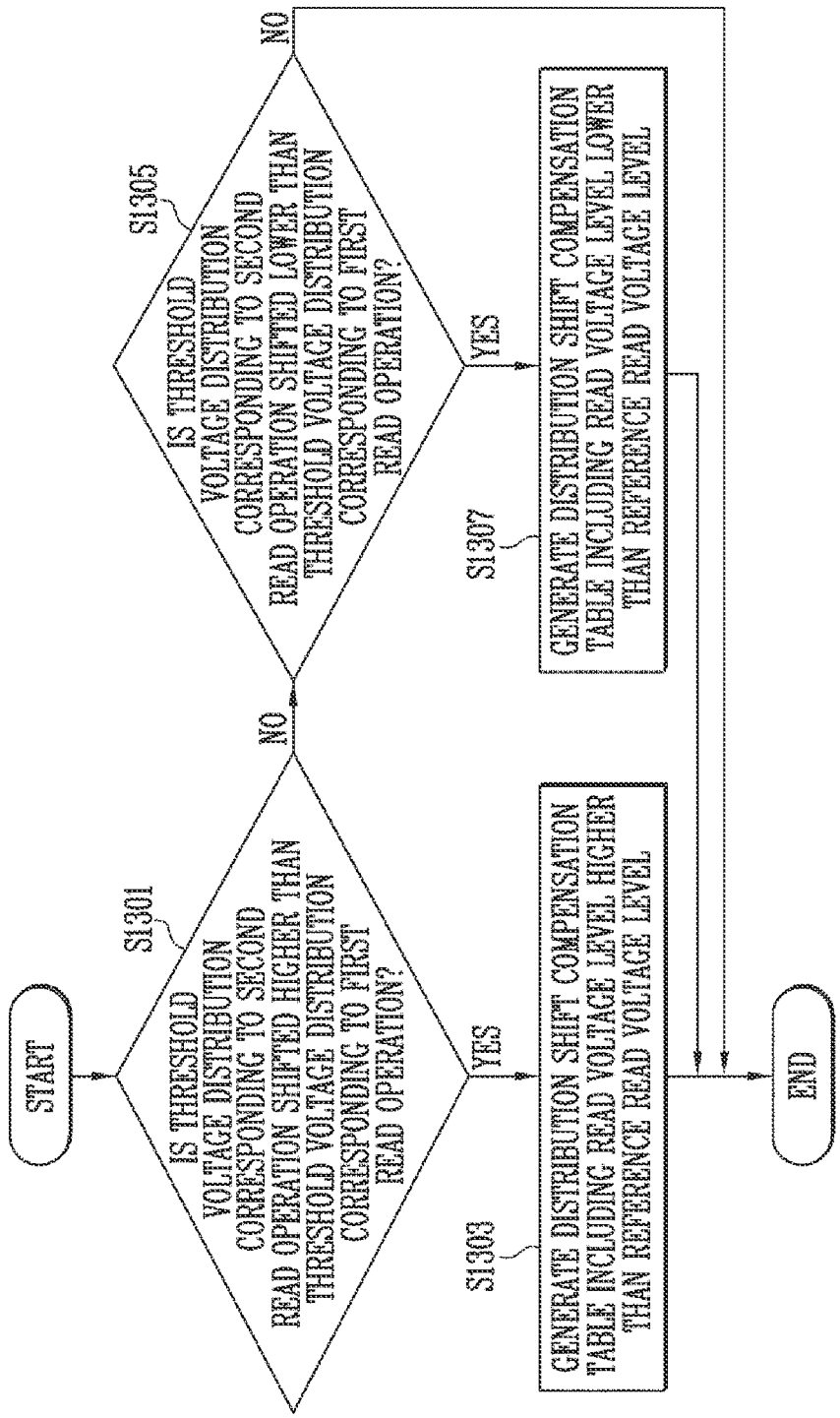
FIG. 13 is a flowchart illustrating a method of generating a distribution shift compensation table including a read voltage level to be used for a third read operation according to an embodiment of the present disclosure.

FIG. 13 is a flowchart illustrating a method of generating a distribution shift compensation table including a read voltage level to be used for a third read operation according to an embodiment of the present disclosure.

The method shown in FIG. 13 may be performed, for example, by the memory device 100 shown in FIG. 1.

Referring to FIG. 13, in step S1301, the memory device 100 may compare the threshold voltage distribution corresponding to the second read operation and the threshold voltage distribution corresponding to the first read operation to determine whether the threshold voltage distribution corresponding to the second read operation is shifted higher than the threshold voltage distribution corresponding to the first read operation.

When the threshold voltage distribution corresponding to the second read operation is shifted higher than the threshold voltage distribution corresponding to the first read operation according to a result of the determination in step S1301, in step S1303, the memory device 100 may generate the distribution shift compensation table including the read voltage level higher than the reference read voltage level based on the shift distance.

When the threshold voltage distribution corresponding to the second read operation is not shifted higher than the threshold voltage distribution corresponding to the first read operation according to the result of the determination in step S1301, in step S1305, the memory device 100 may compare the threshold voltage distribution corresponding to the second read operation and the threshold voltage distribution corresponding to the first read operation to determine whether the threshold voltage distribution corresponding to the second read operation is shifted lower than the threshold voltage distribution corresponding to the first read operation.

When the threshold voltage distribution corresponding to the second read operation is shifted lower than the threshold voltage distribution corresponding to the first read operation according to a result of the determination in step S1305, in step S1307, the memory device 100 may generate the distribution shift compensation table including the read voltage level lower than the reference read voltage level based on the shift distance.

When the threshold voltage distribution corresponding to the second read operation is not shifted lower than the threshold voltage distribution corresponding to the first read operation according to the result of the determination in step S1305, the operation of generating the distribution shift compensation table may be ended.

Figure 14:
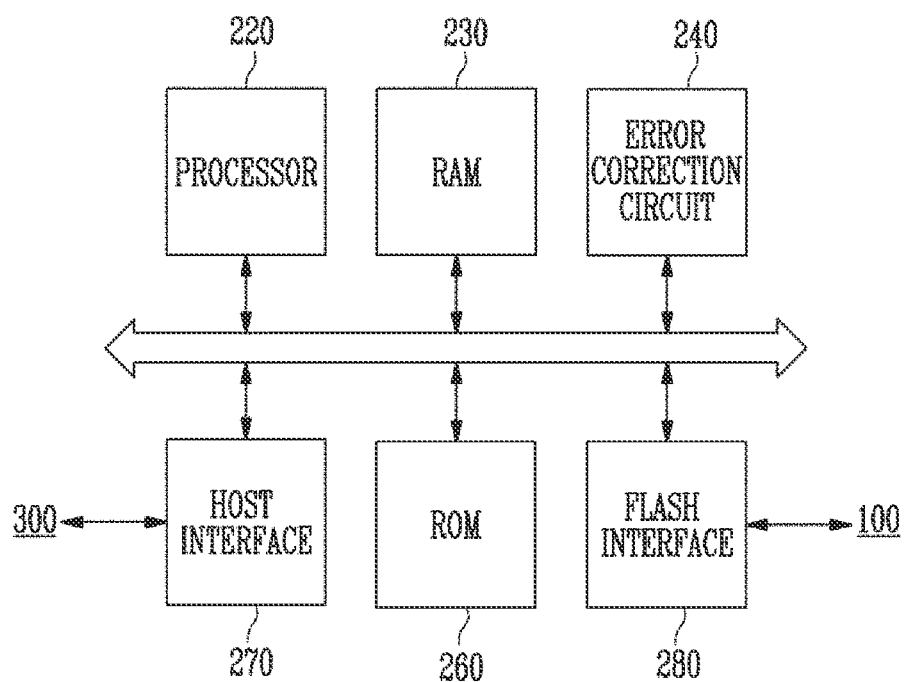
FIG. 14 is a diagram illustrating a memory controller of FIG. 1.

FIG. 14 is a diagram illustrating the memory controller of FIG. 1.

Referring to FIGS. 1 and 14, the memory controller 200 may include a processor 220, a RAM 230, an error correction circuit 240, a ROM 260, a host interface 270, and a flash interface 280.

The processor 220 may control an overall operation of the memory controller 200. The RAM 230 may be used as a buffer memory, a cache memory, an operation memory, and the like of the memory controller 200.

The error correction circuit 240 may perform error correction. The error correction circuit 240 may perform error correction encoding (ECC encoding) based on data to be written to the memory device 100 through the flash interface 280. The error correction encoded data may be transferred to the memory device 100 through the flash interface 280. The error correction circuit 240 may perform error correction decoding (ECC decoding) on data received from the memory device 100 through the flash interface 280. For example, the error correction circuit 240 may be included in the flash interface 280 as a component of the flash interface 280.

The ROM 260 may store various information required for the memory controller 200 to operate in a firmware form.

The memory controller 200 may communicate with an external device (for example, the host 300, an application processor, and the like) through the host interface 270.

The memory controller 200 may communicate with the memory device 100 through the flash interface 280. The memory controller 200 may transmit a command, an address, a control signal, and the like to the memory device 100 and receive data through the flash interface 280. For example, the flash interface 280 may include a NAND interface.

Figure 15:
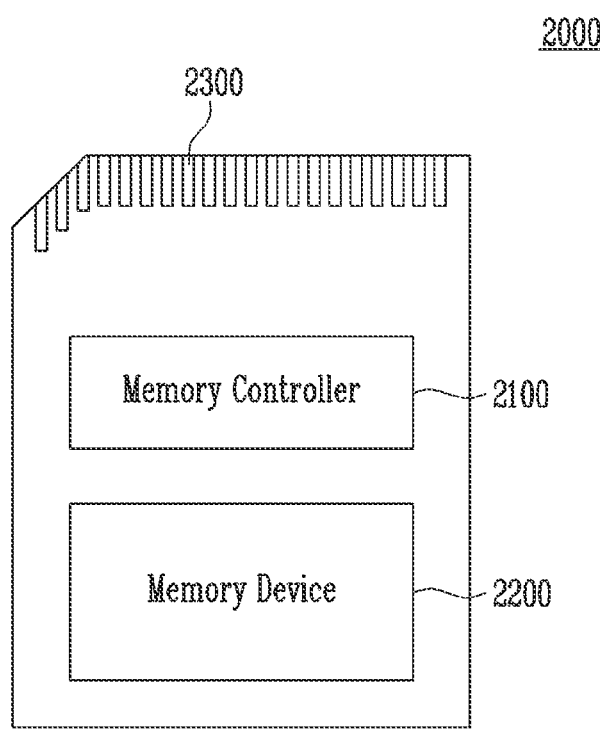
FIG. 15 is a block diagram illustrating a memory card system to which a storage device according to an embodiment of the present disclosure is applied.

FIG. 15 is a block diagram illustrating a memory card system to which a storage device according to an embodiment of the present disclosure is applied.

Referring to FIG. 15, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, write, erase, and background operations of the memory device 2200. The memory controller 2100 is configured to provide an interface between the memory device 2200 and a host. The memory controller 2100 is configured to drive firmware for controlling the memory device 2200. The memory controller 2100 may be implemented equally to the memory controller 200 described with reference to FIG. 1. The memory device 2200 may be implemented identically to the memory device 100 described with reference to FIG. 2.

For example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer small interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be configured of various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 16:
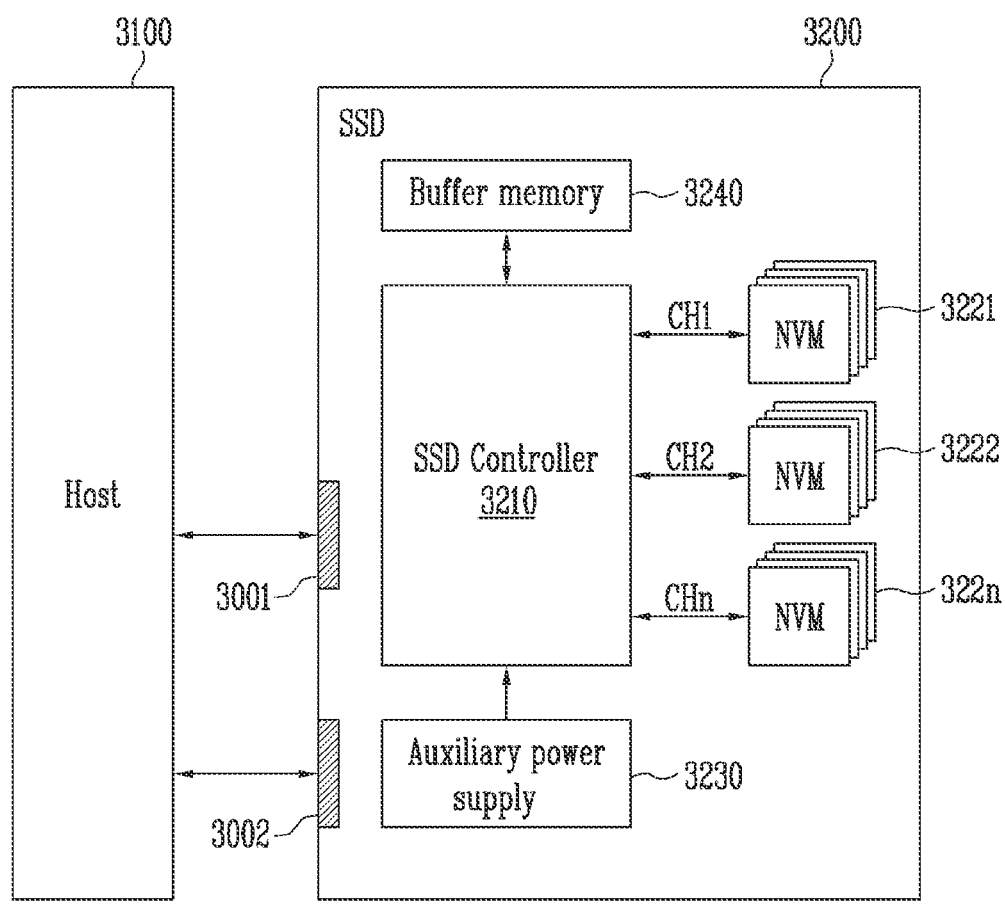
FIG. 16 is a block diagram illustrating a solid state drive (SSD) system to which a storage device according to an embodiment of the present disclosure is applied.

FIG. 16 is a block diagram illustrating a solid state drive (SSD) system to which a storage device according to an embodiment of the present disclosure is applied.

Referring to FIG. 16, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

According to an embodiment of the present disclosure, the SSD controller 3210 may perform the function of the memory controller 200 described with reference to FIG. 1.

The SSD controller 3210 may control the plurality of flash memories 3221 to 322n in response to the signal SIG received from the host 3100. For example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer small interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. For example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store meta data (for example, a mapping table) of the flash memories 3221 to 322n. The buffer memory 3240 may include a volatile memory such as a DRAM, an SDRAM, a DDR SDRAM, an LPDDR SDRAM, and a GRAM, or a nonvolatile memory such as an FRAM, a ReRAM, an STT-MRAM, and a PRAM.

Figure 17:
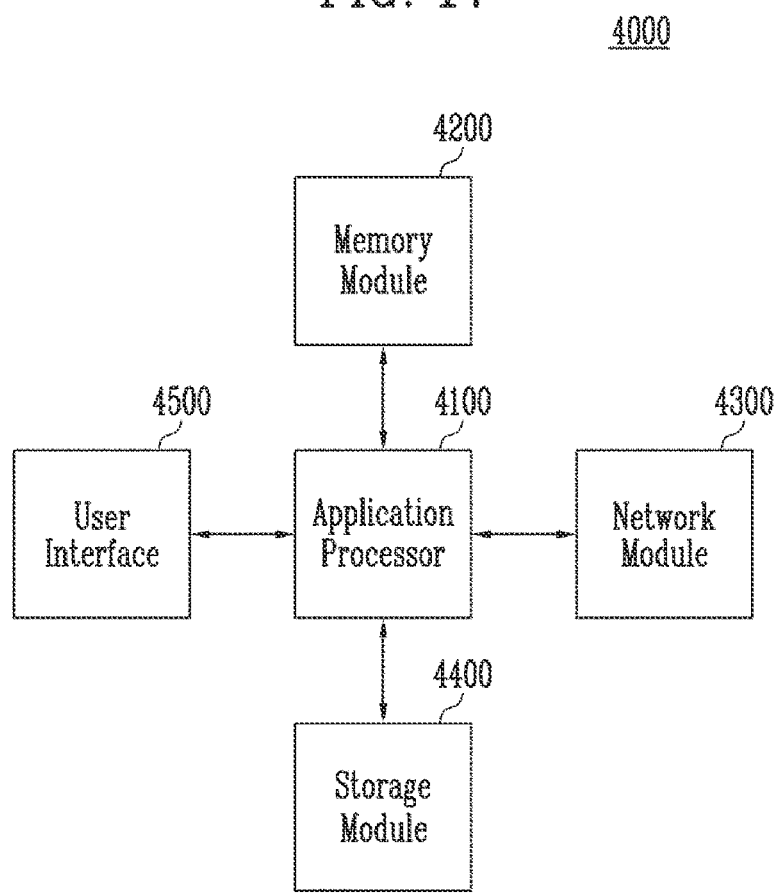
FIG. 17 is a block diagram illustrating a user system to which a storage device according to an embodiment of the present disclosure is applied.

FIG. 17 is a block diagram illustrating a user system to which a storage device according to an embodiment of the present disclosure is applied.

Referring to FIG. 17, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a nonvolatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device comprising:
   a plurality of memory cells;
   a threshold voltage distribution measurement component configured to measure a threshold voltage distribution of a first read operation of sensing data from programmed memory cells among the plurality of memory cells, and a threshold voltage distribution of a second read operation of sensing the data from the programmed memory cells and outputting the data using a data out operation;
   a distribution shift compensation table generator configured to calculate a shift direction indicating a direction in which the threshold voltage distribution of the second read operation is shifted and a shift distance indicating a distance at which the threshold voltage distribution of the second read operation is shifted based on the threshold voltage distribution of the first read operation, based on a result of comparing the threshold voltage distribution of the first read operation and the threshold voltage distribution of the second read operation, and generate a distribution shift compensation table based on the shift direction and the shift distance; and a read operation controller configured to perform a third read operation on target memory cells among the plurality of memory cells based on the distribution shift compensation table.

2. The memory device of claim 1, wherein the threshold voltage distribution measurement component measures the threshold voltage distribution of the first read operation by calculating the number of fail bits of data sensed by the first read operation on the programmed memory cells, and the threshold voltage distribution of the second read operation by calculating the number of fail bits of the data sensed by the second read operation on the programmed memory cells.

3. The memory device of claim 1, wherein the third read operation is an operation of sensing the data from the programmed memory cells and outputting the data using the data out operation, after the distribution shift compensation table is generated.

4. The memory device of claim 1, wherein the distribution shift compensation table includes at least one of an evaluation time and a read voltage level to be used for the third read operation.

5. The memory device of claim 4, wherein when the threshold voltage distribution of the second read operation is shifted higher than the threshold voltage distribution of the first read operation, the distribution shift compensation table generator generates the distribution shift compensation table including an evaluation time increased to greater than a reference evaluation time based on the shift distance.

6. The memory device of claim 4, wherein when the threshold voltage distribution of the second read operation is shifted lower than the threshold voltage distribution of the first read operation, the distribution shift compensation table generator generates the distribution shift compensation table including an evaluation time decreased to less than a reference evaluation time based on the shift distance.

7. The memory device of claim 4, wherein when the threshold voltage distribution of the second read operation is shifted higher than the threshold voltage distribution of the first read operation, the distribution shift compensation table generator generates the distribution shift compensation table including a read voltage level higher than a reference read voltage level based on the shift distance.

8. The memory device of claim 4, wherein when the threshold voltage distribution of the second read operation is shifted lower than the threshold voltage distribution of the first read operation, the distribution shift compensation table generator generates the distribution shift compensation table including a read voltage level lower than a reference read voltage level based on the shift distance.

9. The memory device of claim 4, wherein the read operation controller performs the third read operation using at least one of the evaluation time and the read voltage level.

10. The memory device of claim 1, further comprising:
a distribution shift compensation table storage configured to store the distribution shift compensation table.

11. A method of operating a memory device, the method comprising:
performing a program operation on a plurality of memory cells;

measuring a threshold voltage distribution of a first read operation by performing the first read operation of sensing data from the plurality of memory cells;

measuring a threshold voltage distribution of a second read operation by performing the second read operation of sensing the data from the plurality of memory cells and outputting the data using a data out operation;

calculating a shift direction indicating a direction in which the threshold voltage distribution of the second read operation is shifted and a shift distance indicating a distance at which the threshold voltage distribution of the second read operation is shifted based on the threshold voltage distribution of the first read operation, based on a result of comparing the threshold voltage distribution of the first read operation and the threshold voltage distribution of the second read operation;

generating a distribution shift compensation table based on the shift direction and the shift distance; and performing a third read operation on target memory cells based on the distribution shift compensation table.

12. The method of claim 11, wherein measuring the threshold voltage distribution of the first read operation comprises measuring the threshold voltage distribution of the first read operation by calculating the number of fail bits of the data sensed by the first read operation on the plurality of memory cells.

13. The method of claim 11, wherein measuring the threshold voltage distribution of the second read operation comprises measuring the threshold voltage distribution of the second read operation by calculating the number of fail bits of the data sensed by the second read operation on the plurality of memory cells.

14. The method of claim 11, wherein the distribution shift compensation table includes at least one of an evaluation time and a read voltage level to be used for the third read operation.

15. The method of claim 14, wherein generating comprises generating the distribution shift compensation table the distribution shift compensation table including an evaluation time increased to greater than a reference evaluation time based on the shift distance, when the threshold voltage distribution of the second read operation is shifted higher than the threshold voltage distribution of the first read operation.

16. The method of claim 14, wherein generating comprises generating the distribution shift compensation table including an evaluation time decreased to less than a reference evaluation time based on the shift distance, when the threshold voltage distribution of the second read operation is shifted lower than the threshold voltage distribution of the first read operation.

17. The method of claim 14, wherein generating comprises generating the distribution shift compensation table including a read voltage level higher than a reference read voltage level based on the shift distance, when the threshold voltage distribution of the second read operation is shifted higher than the threshold voltage distribution of the first read operation.

18. The method of claim 14, wherein generating comprises generating the distribution shift compensation table including a read voltage level lower than a reference read voltage level based on the shift distance, when the threshold voltage distribution of the second read operation is shifted lower than the threshold voltage distribution of the first read operation.

19. The method of claim 14, wherein performing comprises performing the third read operation using at least one of the evaluation time and the read voltage level.

20. The method of claim 11, further comprising storing the distribution shift compensation table.

* * * * *